United States Patent
Hsuan et al.

(10) Patent No.: US 6,239,366 B1
(45) Date of Patent: *May 29, 2001

(54) FACE-TO-FACE MULTI-CHIP PACKAGE

(75) Inventors: Min-Chih Hsuan, Hsinchu; Cheng-Te Lin, Taipei Hsien, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,838

(22) Filed: Feb. 1, 1999

(51) Int. Cl.[7] ........................................ H05K 5/06
(52) U.S. Cl. ...................... 174/52.3; 361/707; 361/708; 361/709; 257/723; 257/777; 257/778
(58) Field of Search ........................ 174/52.3; 361/707, 361/708, 709; 257/777, 723, 778

(56) References Cited

U.S. PATENT DOCUMENTS

| | | | |
|---|---|---|---|
| 5,285,352 | * 2/1994 | Pastore et al. | 361/707 |
| 5,734,199 | * 3/1998 | Kawakita et al. | 257/737 |
| 5,757,080 | * 5/1998 | Sota | 257/777 |
| 5,773,896 | * 6/1998 | Fujimoto et al. | 257/777 |
| 5,777,345 | * 7/1998 | Loder et al. | 257/777 |
| 5,790,384 | * 8/1998 | Ahmad et al. | 361/760 |
| 5,804,882 | * 9/1998 | Tsukagishi et al. | 257/783 |
| 5,872,700 | * 2/1999 | Collander | 361/760 |
| 5,894,165 | * 4/1999 | Ma et al. | 257/666 |
| 5,936,305 | * 10/1999 | Akram | 257/723 |

* cited by examiner

Primary Examiner—William A. Cuchlinski, Jr.
Assistant Examiner—Ronnie Mancho (57) ABSTRACT

A face-to-face multi-chip package comprises a lead frame comprising at least a die pad and a plurality of leads, wherein the leads further comprise a plurality of inner leads and a plurality of outer leads. The package further comprises at least three chips, each having a surface comprising a plurality of pads. The chips are disposed with the surfaces comprising the pads face to face. A plurality of bumps are disposed on some of the pads to electrically connect the chips. A plurality of electrical conductors connects predetermined ones of the pads to the inner leads; and an insulation material fully or partially seals the die pad, the chips and the inner leads.

11 Claims, 7 Drawing Sheets

FACE-TO-FACE MULTI-CHIP PACKAGE

BACKGROUND OF THE INVENTION

1. Field of the Invention

The invention relates to a semiconductor packaging structure, and more particularly, to a face-to face multi-chip package.

2. Description of the Related Art

As the technology of semiconductor fabrication grows more and more advanced, the relevant techniques have to be further developed to coordinate the requirements of the semiconductor devices. The fabrication process of a semiconductor device typically includes three stages. In the first stage, an epitaxy technique is used for the formation of a semiconductor substrate. Semiconductor devices such as metal-oxide semiconductor (MOS) and multilevel interconnection are fabricated on the substrate in the second stage. The third stage is the packaging process. It is now a leading trend for fabricating a device or an electronic product with a thin, light, and small dimension, that is, with a higher integration for semiconductor devices. In terms of packages, many techniques such as chip scale package, multi-chip module (MCM) have been developed to obtain a high integration. The development of the fabrication technique with a line width of 0.18 $\mu$m has evoked a great interest and intensive research to further decrease the package volume. It is thus one of the very important package techniques to arrange more than one chip into a single package. In a multi-chip package, chips of processor, memory, including dynamic random access memory (DRAM) and flash memory, and logic circuit can be packed together in a single package to reduce the fabrication cost and the packaging volume. Furthermore, the signal transmission path is shortened to enhance the efficiency. The multi-chip IC packaging technology may also be applied to a multi-chip system with variable functions and operation frequencies, for example, 1. A system comprises memory chips, microprocessors, resistors, capacitors, and inductors.
2. A system comprises memory chips (DRAM), logic circuit chips, and memory chips (Flash memory),
3. A system comprises analog chips, logic circuit chips, memory chips (including DRAM, SRAM, Flash memory), resistor, capacitor, and inductor.

Figure 1:
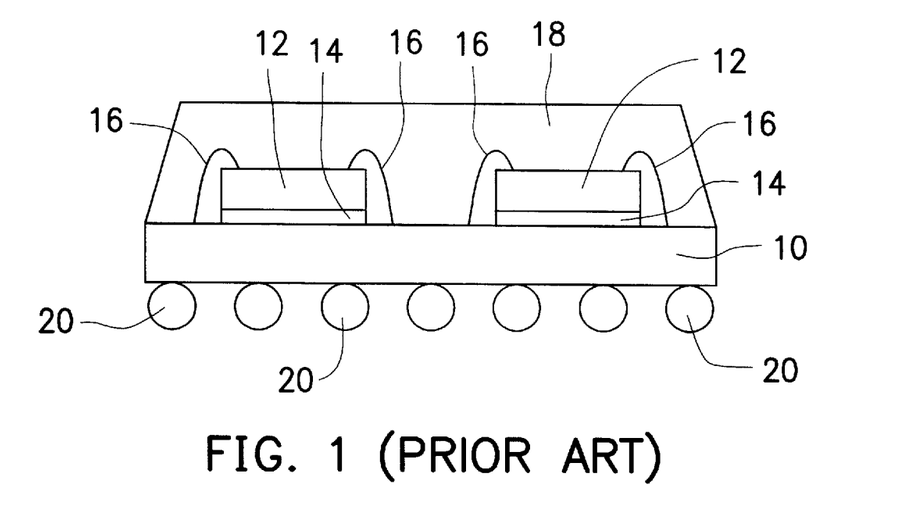
FIG. 1 shows a conventional multi-chip module package.

In FIG. 1, a conventional multi-chip module is shown. A multi-level printed circuit board (PCB) is typically applied as a substrate of the to the carrier of a multi-chip module. More than one chip 12 are adhered on the substrate 10 by insulation glue 14. The bonding pads on the chip 12 are electrically connected to the terminals on the substrate 10 by conductive wires 16. In addition to wire bonding, the connection between the chip 12 and the substrate 10 can also be established by flip chip or controlled collapse chip connection (C4) with the formation of a bump. A resin 18 is used to seal the chip 12, and the electrical connection between the whole package and a printed circuit board can be achieved by ball grid array (BGA) which use solder balls 20 to connect the terminals on the printed circuit board. The drawback of this conventional multi-chip module is that a large surface is occupied since chips are packaged on the same side of surface. Therefore, the surface area of the package is large, and the signal path between chips is long. In addition, though the volume of the package can be reduced by using flip chip technique to achieve the connection between the chip and the carrier, the connection between chips still has to be achieved by the technique of printed circuits on the substrate 10. Therefore, it is not possible to effectively reduce signal transmission path and to shrink the volume or surface area at once. A low yield and a high cost are thus experienced in the prior art.

Figure 2:
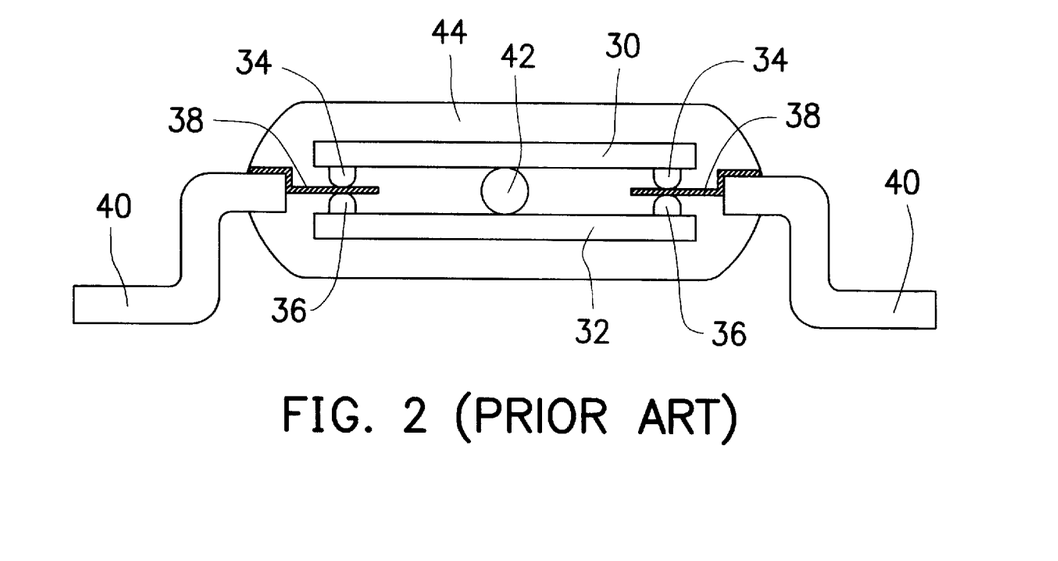
FIG. 2 is a cross sectional view showing a conventional face-to-face multi-chip module package.

To further shrink the volume of package, a face to face multi-chip package is disclosed in U.S. Pat. No. 5,331,235. In FIG. 2, this multi-chip package comprises two chips 30 and 32 disposed face to face by way of tape automatic bonding (TAB). FIG. 2 illustrates inner lead bonding (ILB), whereby two chips 30, 32 having bumps 34, 36 are electrically connected to the film carrier 38. FIG. 2, further illustrates outer lead bonding (OLB), whereby the chips 30, 32 are connected to a lead frame 40. A solder ball 42 is formed between the chips 30, 32. The chips 30, 32, the film carrier 38 and the lead frame 40 are then molded with resin 44. This multi-chip package uses tape automatic bonding technique. The electrical connection between chips and printed circuit board is achieved by the installation of a lead frame or other carriers. The signal transmission path is lengthened. In addition, a film carrier is used to achieve the connection between chips, the layout of metal pad on the chips is formed by a line layout or a peripheral layout. Thus, the manners of line layout or peripheral layout can not meet the integration requirement for semiconductors with greatly increased number of input/output (I/O) nodes due to further higher integration.

SUMMARY OF THE INVENTION

The invention provides a face-to-face multi-chip package with a reduced thickness and surface area. More than one chip can be packaged on one carrier.

It is another object of the invention to provide a face-to-face multi-chip package. The multi-chip chip scale package has a shortened signal transmission path to enhance the performance of the chips.

Bonding pads are allocated on the chip with as an area array to increase the integration of the package. In addition, the rear sides of chips are bared, so that the heat dissipation is enhanced.

To achieve the above-mentioned objects and advantages, a face-to-face multi-chip package is provided. A flip-chip technique is employed. More than one chip are disposed face-to-face and electrically connected via bumps.

In another embodiment of the invention, an anisotropic conductive pasted is filled between the chips to replace the conventional filled material of epoxy to fix the chips. The anisotropic conductive pasted material usually performs like an insulating material except being pressed. Thereby, the anisotropic conductive pasted material can improve the electrical connection at the connecting points, as the chips are pressed to each other for connection. A flip chip technique is used, so that the pads can be distributed on the pads in an area array. Therefore, the integration is enhanced. A heat dissipation apparatus can be further installed on the other side of the chips to improve the performance of heat dissipation.

In addition, the face-to-face multi-chip package in the invention can use lead frame, film carrier, printed circuit board, or glass as a carrier. The package is applicable in many different types of packages such as ball grid array package, chips on board (COB), chips on glass (COG), and multi-chip chip scale package (MCCSP). An improved packaging quality and an enhanced reliability are obtained.

Both the foregoing general description and the following detailed description are exemplary and explanatory only and are not restrictive of the invention, as claimed.

DESCRIPTION OF THE PREFERRED EMBODIMENTS

During the process of packages, several stages are typically included:

1) Selection of carriers: types of chips have to be selected according specific requirement, for example, lead frame, film carrier, or printed circuit board. The film carriers are commonly used for the technique of tape automatic bonding (TAB);

2) Electrical connections between chips and carriers: currently, techniques such as wire bonding, film automatic bonding, and flip chip or controlled collapse chip connection (C4) have been developed and widely used; and 3) Package and device sealing: chips and carriers are covered or sealed by resin, ceramic or other packaging material to protect the devices on the chips and the connections between the chips and the carriers.

First Embodiment

Figure 3A:
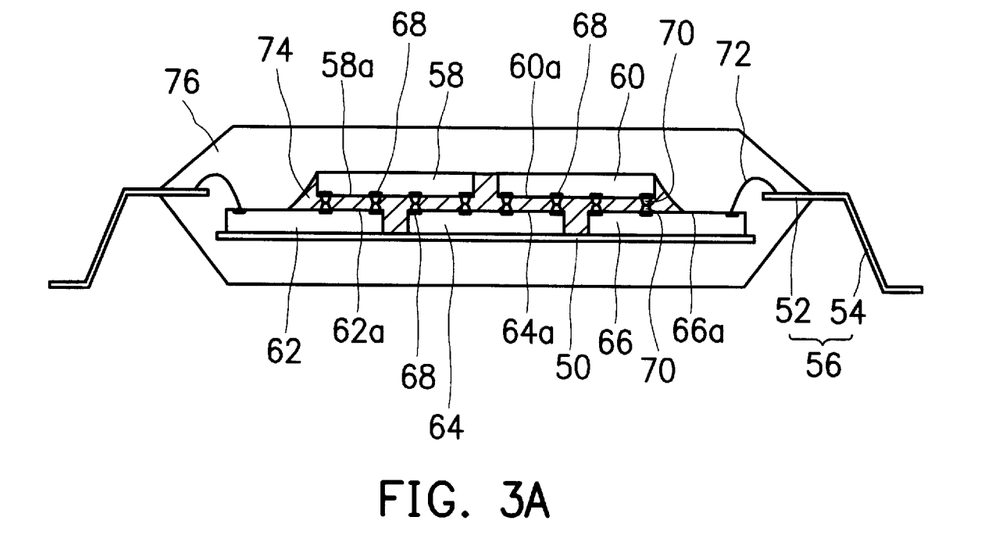
FIG. 3A and FIG. 3B are cross sectional views showing a face-to-face multi-chip package in a first embodiment according to the invention.
Figure 3B:
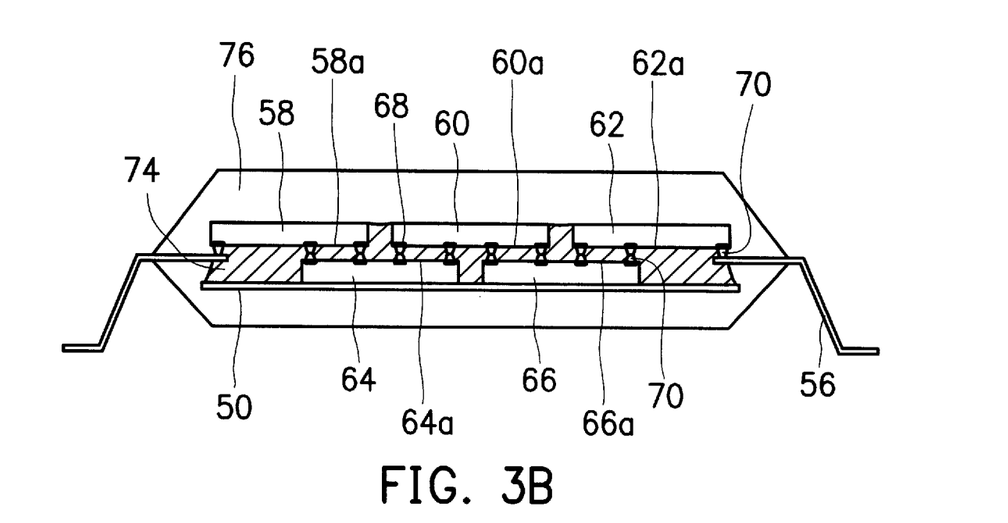

In FIG. 3A and FIG. 3B, cross sectional view of a multi-chip chip-scale package is shown. In the invention, a lead frame is in use as a carrier. Typically, the lead frame comprises a die pad 50 and several leads 56. The leads 56 are further categorized into a part of inner leads 52 and the other part of outer leads 54. Multiple chips 58, 60, 62, 64 and 66 are packed into a package with a volume about the same of a total volume of all these chips 58 to 66. The chips 58 to 66 may include DRAM, read only memory (ROM), LOGIC or ANALOG circuits, or other devices. Each of the chips 58 to 66 has a surface 58a to 66a, respectively, which comprise several pads 68. The invention adapts the flip chip technique. A bump 70 is formed on each pad 68. The chips 58 to 66 are disposed face-to-face and electrically connected with each other via the bumps 70. Since the flip-chip technique is employed, the pads 68 can be designed with an area array layout distributed on the chips 58 to 66. The design can thus be applied in a semiconductor with a high integration and many I/O nodes.

Regarding to the electrical connection between the chips 58 to 66 and the lead frame, a conventional wire bonding can be used. Using thread-like conductive material 72, for example, gold, aluminum threads or other metal threads or conductive wires, a part of the pads 68 are connected to the inner leads 52. Or alternatively, using flip-chip technique, the bumps 70 is electrically connected to the inner leads 52 (as shown in FIG. 3B). A filling material 74, for example, insulation material such as epoxy is filled between the chips 58 to 66. An anisotropic conductive paste (ACP) may also be used to improve the performance of electrical connection between bumps 70. The ACP material usually performs like an insulating material except being pressed. If the filling material 74 uses the ACP material, the regions around the bumps 70 physically experience the pressing force when the bumps 70 are pressed to each other for connection. Thereby, the ACP material is transformed to a conductive material at the regions around the bumps 70 but the other regions remain insulating. This can improve the electrical connection between the bumps 70. For the packaging and molding part, insulation material 76 such as epoxy is used to seal the die pad 50, the chips 58 to 66, and the inner leads 52.

Figure 3C:
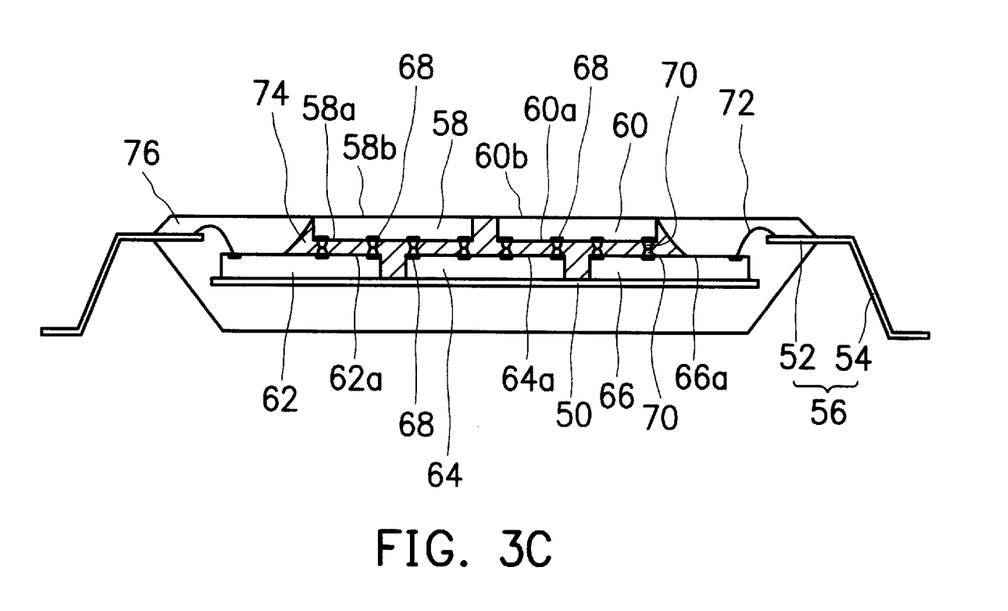
FIG. 3C and FIG. 3D are cross sectional views showing the face-to-face multi-chip package in the first embodiment added with a heat dissipation apparatus.
Figure 3D:
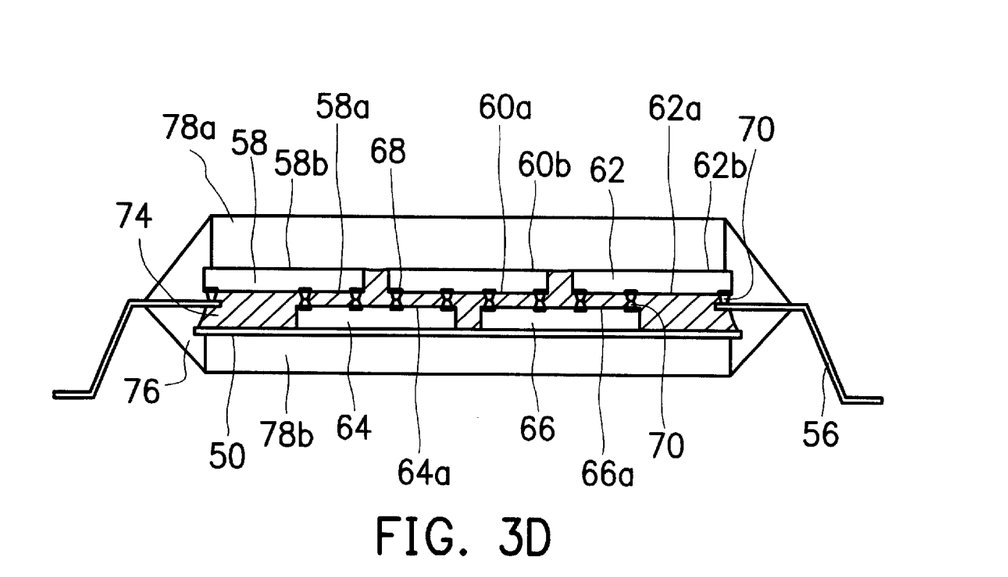

Referring to FIGS. 3C and 3D, a face-to-face multi-chip package with a heat dissipation apparatus is shown. Considering the heat dissipation of the package, the rear surfaces 58b, 60b of the chips 58, 60 are bared (as shown in FIG. 3C). In this way, the thickness of the package is reduced, and a better path for heat dissipation is provided. For further enhancing the performance of heat dissipation, a heat dissipation apparatus 78a such as a heat spreader or a heat sink can be further disposed above the rear surfaces 58b to 62b of the chips 58 to 62. Or another heat dissipation apparatus 78b, for example, a heat spreader or a heat sink, can be disposed above the rear surface of the die pad 50 and exposed outside of the insulation material 76.

The subsequent step for forming the leads 56, and the surface mount technique (SMT) used at the junction between the leads 56 and the circuit board are conventional. The detailed description is thus omitted here.

It is appreciated that people skilled in the art may also apply a lead frame without a die pad, for example, a lead on chip (LOC) or chip on lead (COL) structures, to replace the typical lead frame.

Second Embodiment

Figure 4A:
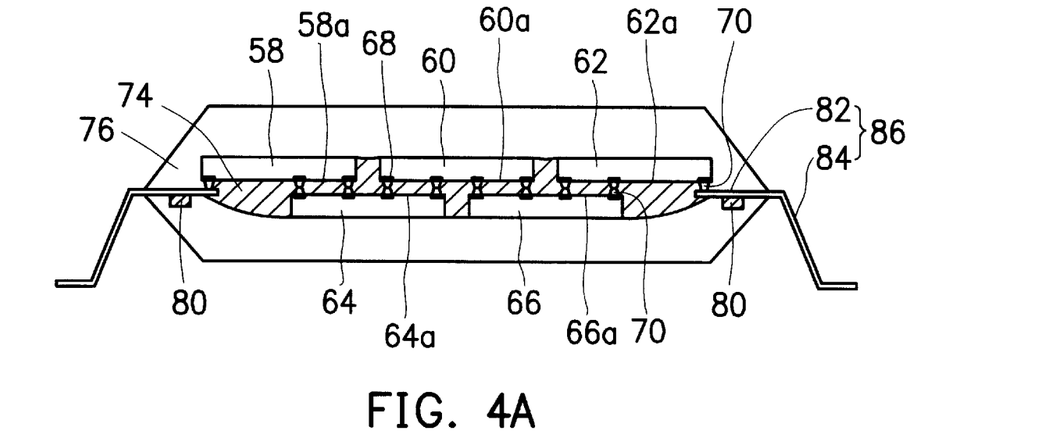
FIG. 4A is a cross sectional view showing a face-to-face multi-chip package in a second embodiment according to the invention.

In FIG. 4A. a cross sectional view of a multi-chip chip-scale package is shown. In the invention, a film carrier is in use. Typically, the film carrier comprises a flexible film 80 and several leads 86. In this manner, the leads 86 are pre-positioned on the flexible film 80. There is no need of die pad. The leads 86 are further categorized into a part of inner leads 82 and the other part of outer leads 84. Each of the chips 58, 60, 62, 64 and 66 having a surface 58a, 60a, 62a, 64a, and 66a, respectively, which comprise several pads 68. The invention adapts the flip chip technique. A bump 70 is formed on each pad 68. The chips 58 to 66 are disposed face-to-face and electrically connected with each other via the bumps 70. Since the flip-chip technique is employed, the pads 68 can be designed with an area array layout distributed on the chips 58 to 66. The design can thus be applied in a semiconductor with a high integration and many I/O nodes.

Regarding to the electrical connection between the chips 58 to 66 and the leads 86, the flip-chip technique can be used. The bumps 70 are electrically connected to the leads 86. A filling material 74, for example, insulation material such as epoxy is filled between the chips 58 to 66. An anisotropic conductive paste (ACP) may also be used to improve the performance of electrical connection between bumps 70. For the packaging and molding part, an insulation material 76 such as epoxy is used to seal the chips 58 to 66, and the inner leads 82.

Figure 4B:
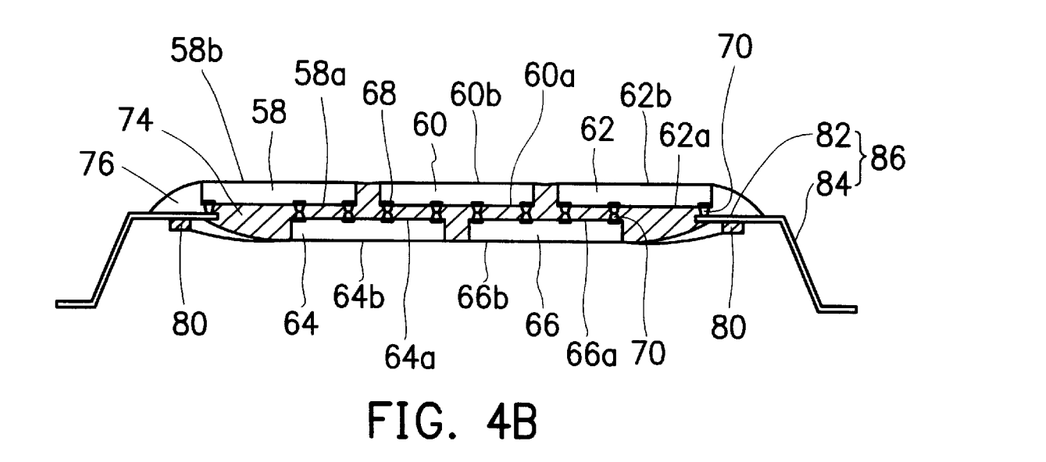
FIG. 4B to FIG. 4C are cross sectional views showing the face-to-face multi-chip package in the second embodiment added with a heat dissipation apparatus.
Figure 4C:
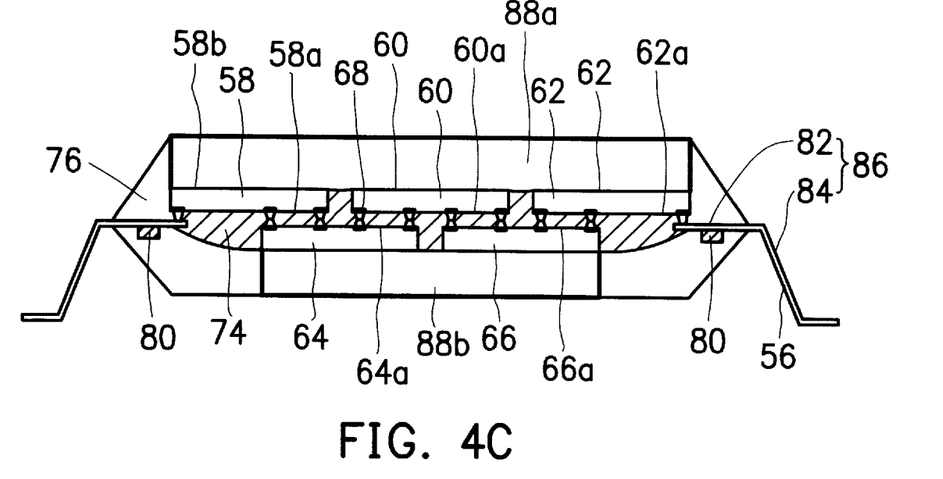

Referring to FIG. 4C, a face-to-face multi-chip package with a heat dissipation apparatus is shown. Considering the heat dissipation of the package, some or all of the rear surfaces 58b, 60b, 62b, 64b, and 66b of the chips 58 to 66 are bared (as shown in FIG. 4B). In this way, the thickness of the package is reduced, and a better path for heat dissipation is provided. For further enhancing the performance of heat dissipation, a heat dissipation apparatus 88a such as a heat spreader or a heat sink can be further disposed above the rear surfaces 58b to 62b of the chips 58 to 62. Or another heat dissipation apparatus 88b, for example, a heat spreader or a heat sink, can be disposed above the rear surfaces 64b and 66b of the chips 64 and 66 and exposed outside of the insulation material 76.

In the subsequent step for forming the leads 86, and the surface mount technique (SMT) used at the junction between the leads 86 and the circuit board are conventional. The detailed description is thus omitted here.

Third Embodiment

Figure 5A:
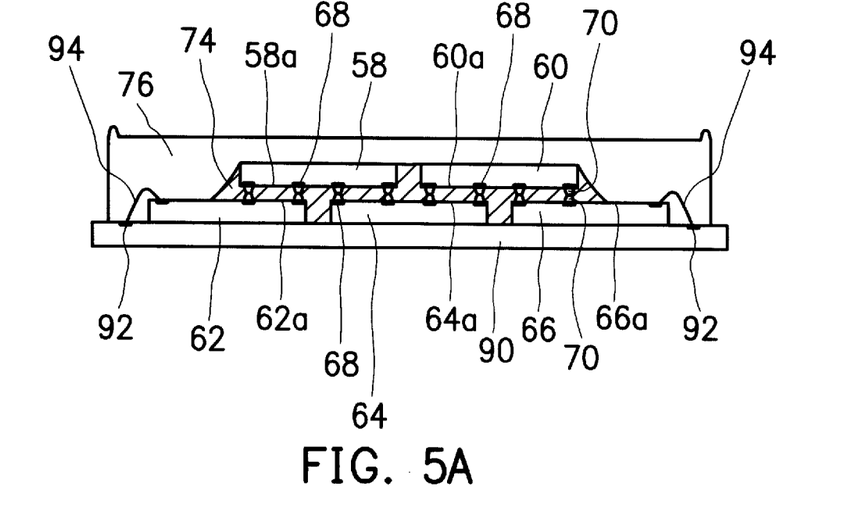
FIG. 5A and FIG. 5B are cross sectional views showing a face-to-face multi-chip package in a third embodiment according to the invention.
Figure 5B:
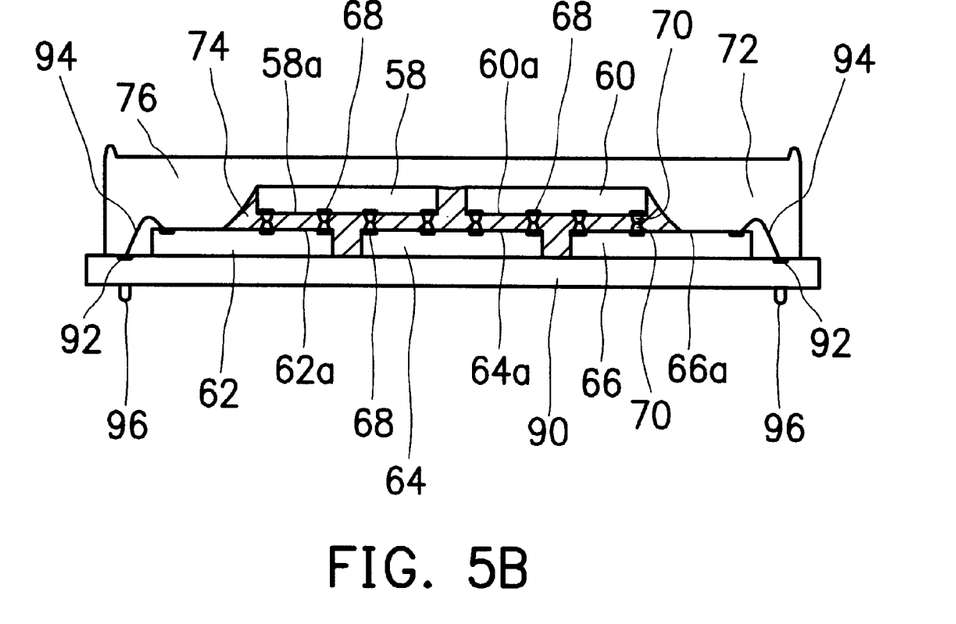

In FIG. 5A, another face-to-face multi-chip package is shown. A printed circuit board (PCB) or a glass is used as a carrier. Typically, a PCB or glass carrier comprises a substrate 90, for example, FR-4, FR-5, BT or glass substrate. The substrate 90 has several terminals 92. While a PCB is in used, the chip-on-board (COB) technique or a substrate comprising a BGA is employed for packaging. The substrate 90 is formed of lamination of layers of insulation material or printed circuits (copper foils). The chips 58, 60, 62, 64, 66 each has a surface 58a, 60a, 62a, 64a, 66a, respectively. Several pads 68 are formed on each of the surfaces 58a to 66a. The connections between the chips 58 to 66 adapt the flip chip technique. Bumps 70 are formed on each of the pads 68. The chips 58 to 66 are face-to-face disposed and electrically connected with each other via bumps 70. Since the flip-chip technique is adapted, the pads 68 can be distributed on the chips 58 to 66 in an area array. It can therefore be applied in a semiconductor with a high integration and many I/O nodes.

Figure 5C:
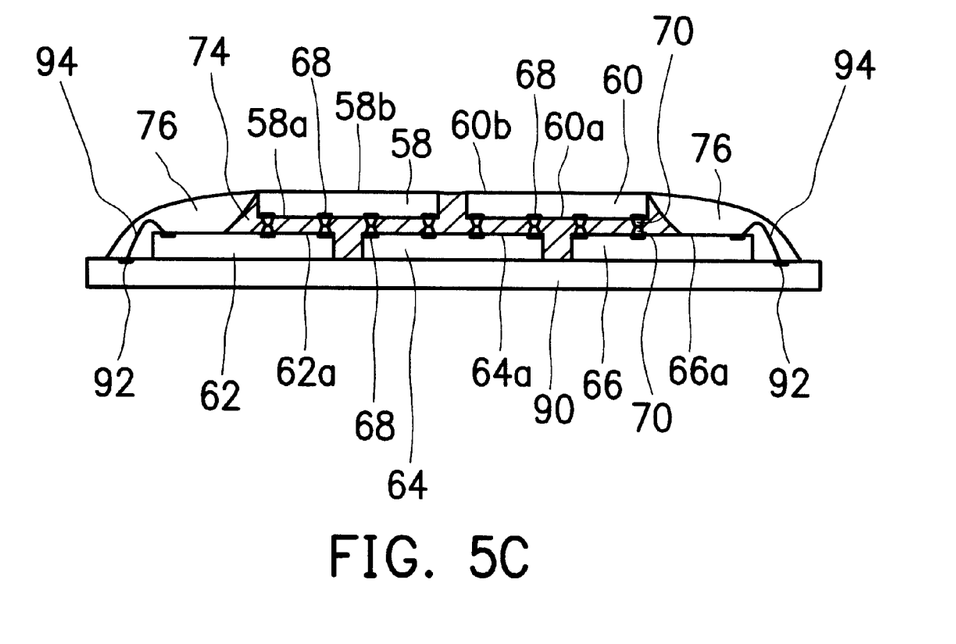
FIG. 5C and FIG. 5D are cross sectional views showing the face-to-face multi-chip package in the third embodiment added with a heat dissipation apparatus.
Figure 5D:
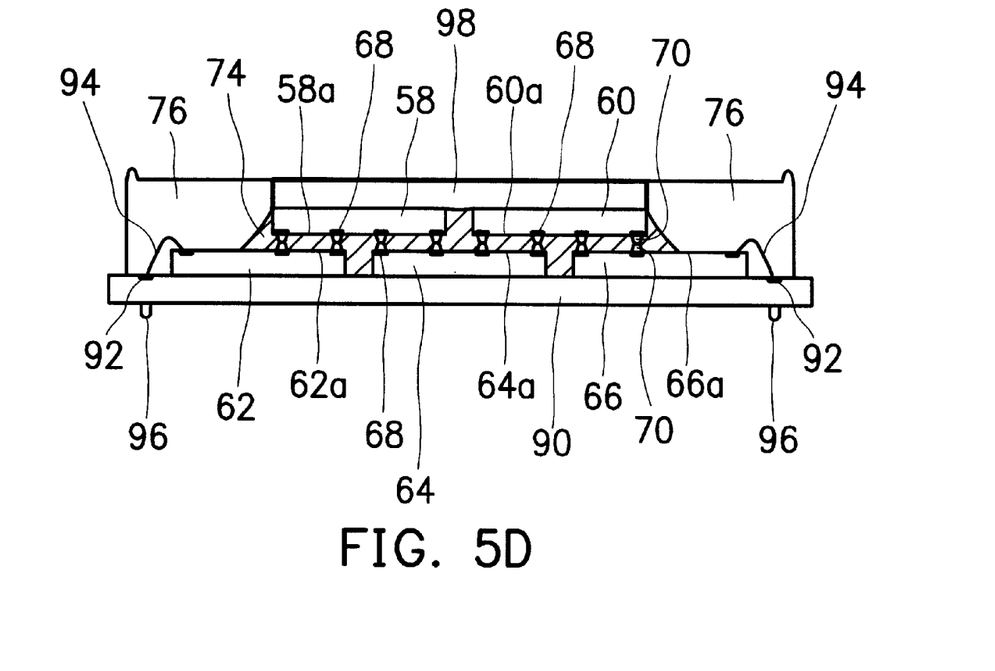

Referring to FIGS. 5C and 5D, a face-to-face multi-chip package with a heat dissipation apparatus is shown. Considering the heat dissipation of the package, some or all of the rear surfaces 58b, 60b, 62b, 64b, and 66b of the chips 58 to 66 are bared. As shown in FIG. 5C, the bared surfaces comprise 58b and 60b. In this way, the thickness of the package is reduced, and a better path for heat dissipation is provided. For further enhancing the performance of heat dissipation, a heat dissipation apparatus 98 such as a heat spreader or a heat sink can be further disposed above the rear surfaces 58b and 66b of the chips 58 and 66. The heat dissipation apparatus 98 is exposed outside of the insulation material 76.

In summary, the advantages of the invention includes at least:
1) The thickness and surface area are reduced by the application of face-to-face multi-chip package. By the employment of flip-chip technique, the pads can be designed as an area array, so that the integration is greatly enhanced.
2) Bumps are formed to achieve the electrical connections between chips, the signal transmission is thus shortened. The performance of the package is thus improved. With the area array layout of the pads, the package can be applied to a semiconductor with a further increased integration and many I/O nodes.
3) The invention may also adapt a bared-chip package, so that the performance of heat dissipation is improved. Furthermore, a heat dissipation can be further installed to further enhance the heat dissipation.
4) The package can be applied to chips including DRAM, ROM, SRAM, Flash Memory, LOGIC or ANALOG circuits. Thus, the field of application is so wide to include apparatus with various functions or frequency, such as communication equipment or computer system, or even a single system chip.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A face-to-face multi-chip package, comprising:
   a leadframe, comprising at least a die pad and a plurality of leads, the leads further comprising a plurality of inner leads and a plurality of outer leads;
   a plurality of chips, each having a surface comprising a plurality of pads, the chips being disposed such that the surface comprising the pads are face to face, wherein the chips are stacked into an upper chip layer and a lower chip layer each of the chip layer having outer edges and comprising at least one chip, such that the chips of each chip layer are mounted side-by-side, the chip layers being disposed on the die pad;
   a plurality of bumps, formed on the pads to electrically connect the chips, wherein a part of the bumps alone are directly connected to the inner leads that approach proximately to the outer edges of one chip layer, without using any bonding wires or conductors; and
   an insulation material, fully or partially sealing the die pad, the chips and the inner leads.

2. The package according to claim 1, wherein an epoxy resin is filled between the chips.

3. The package according to claim 1, wherein an anisotropic conductive paste is filled between the chips.

4. The package according to claim 1, wherein the insulation material comprises epoxy.

5. The package according to claim 1, wherein the pads are distributed on the chips as an area array.

6. The package according to claim 1, wherein the insulation material partially seals the die pad, the chips, and the inner leads, leaving a rear surface of the chips of the upper chip layer exposed.

7. The package according to claim 6, wherein a heat dissipation apparatus is further installed on the exposed rear surface of the chips of the upper chip layer.

8. The package according to claim 1, wherein the insulation material partially seals the die pad, the chips, and the inner leads but leaving an exposed portion on a rear side of the die pad, and a heat dissipation apparatus is installed on the exposed portion of the rear side of the die pad.

9. A face-to-face multi-chip package, comprising:

a plurality of chips, each chip having a surface with a plurality of pads and a plurality of bumps formed on the pads, wherein the chips are face to face connected via the bumps such that the chips are stacked into an upper chip layer and a lower chip layer each of the chip layers having outer edges and comprising at least one chip, wherein the chips of each chip layer are mounted side-by-side;

a plurality of leads, each of the leads comprising an inner lead that approaches proximately to the outer edges of one chip layer to be electrically connected to the chips thereof;

a filling material, filling between the upper chip layer and the lower chip layer, such that the bumps on the surface of each of the chips are protected thereby; and an insulation material, sealing the inner leads and a portion of the chips and leaving a rear side surface of at least one of the upper chip layer and the lower chip layer bare to air.

10. The package according to claim 9, wherein the inner leads are directly connected to a portion of the bumps formed on the pads of the chips.

11. The package according to claim 9, wherein the rear side surface of both the lower chip layer and the upper chip layer is bare to air.

* * * * *